US011929512B2

(12) United States Patent
Kreider et al.

(10) Patent No.: US 11,929,512 B2
(45) Date of Patent: Mar. 12, 2024

(54) OXIDIZED SURFACE LAYER ON TRANSITION METAL NITRIDES: ACTIVE CATALYSTS FOR THE OXYGEN REDUCTION REACTION

(71) Applicant: The Board of Trustees of the Leland Stanford Junior University, Stanford, CA (US)

(72) Inventors: Melissa E. Kreider, Palo Alto, CA (US); Michaela Burke Stevens, Stanford, CA (US); Alessandro Gallo, Palo Alto, CA (US); Hadi Abroshan, Atlanta, GA (US); Seoin Back, Pittsburgh, PA (US); Samira Siahrostami, Calgary (CA); Jens K. Nørskov, Copenhagen (DK); Laurie A. King, Menlo Park, CA (US); Thomas Francisco Jaramillo, Menlo Park, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 133 days.

(21) Appl. No.: 16/420,890

(22) Filed: May 23, 2019

(65) Prior Publication Data
US 2020/0350596 A1  Nov. 5, 2020

Related U.S. Application Data

(60) Provisional application No. 62/840,953, filed on Apr. 30, 2019.

(51) Int. Cl.
*H01M 4/90* (2006.01)
*C23C 14/00* (2006.01)
(Continued)

(52) U.S. Cl.
CPC ....... *H01M 4/9075* (2013.01); *C23C 14/0036* (2013.01); *C23C 14/0641* (2013.01); *H01M 4/8853* (2013.01); *H01M 4/8871* (2013.01); *H01M 4/9016* (2013.01); *H01M 2004/8689* (2013.01)

(58) Field of Classification Search
CPC .................. H01M 4/9075; C23C 14/0641
See application file for complete search history.

(56) References Cited

U.S. PATENT DOCUMENTS 4,452,675 A * 6/1984 Cipris ................. H01M 4/29
429/223
5,935,648 A 8/1999 Roberson
(Continued)

FOREIGN PATENT DOCUMENTS

JP   H059790     * 1/1993
JP   H059790 A   * 1/1993
(Continued)

*Primary Examiner* — Osei K Amponsah
(74) *Attorney, Agent, or Firm* — LUMEN PATENT FIRM

(57) ABSTRACT

An electrode catalyst for an Oxygen Reduction Reaction (ORR) is provided that includes a transition metal nitride layer on a substrate, an ORR surface oxide layer deposited on the transition metal nitride layer, where the ORR surface oxide layer includes from sub-monolayer to 20 surface oxide monolayers.

12 Claims, 11 Drawing Sheets

(51) Int. Cl.
*C23C 14/06* (2006.01)
*H01M 4/88* (2006.01)
*H01M 4/86* (2006.01)

(56) References Cited

U.S. PATENT DOCUMENTS

| | | | |
|---|---|---|---|
| 5,980,977 | A | 11/1999 | Deng |
| 7,125,820 | B2 | 10/2006 | Campbell |
| 7,410,666 | B2 | 8/2008 | Elers |
| 7,871,662 | B2 * | 1/2011 | Frericks ............... A61N 1/0565 |
| | | | 427/126.3 |
| 8,182,950 | B2 | 5/2012 | Kurozumi |
| 8,697,904 | B2 | 4/2014 | Coleman |
| 9,748,580 | B2 | 8/2017 | Ota |
| 2010/0167463 | A1 * | 7/2010 | Sung .................... H01L 45/146 |
| | | | 257/E29.094 |
| 2017/0029930 | A1 | 2/2017 | Ramm |
| 2017/0373311 | A1 | 12/2017 | Salehi-Khojin |

FOREIGN PATENT DOCUMENTS

| | | | |
|---|---|---|---|
| JP | 513282 | * | 2/1993 |
| JP | 05013282 A | * | 2/1993 |
| JP | 2006134603 | * | 5/2006 |
| JP | 2006134603 A | * | 5/2006 |
| WO | WO2018/231998 | | 12/2018 |

* cited by examiner

OXIDIZED SURFACE LAYER ON TRANSITION METAL NITRIDES: ACTIVE CATALYSTS FOR THE OXYGEN REDUCTION REACTION

CROSS-REFERENCE TO RELATED APPLICATIONS

This application claims priority from U.S. Provisional Patent Application 62/840,953 filed Apr. 30, 2019, which is incorporated herein by reference.

FIELD OF THE INVENTION

The present invention relates generally to oxygen reduction reaction (ORR) catalysts. More particularly, the invention relates to a device and method of synthesizing inexpensive, acid-stable, and highly active oxygen reduction reaction (ORR) catalysts.

BACKGROUND OF THE INVENTION

Proton-exchange membrane fuel cells (PEMFCs) are a promising technology towards enabling efficient and clean electricity production for transportation and industrial applications. In a PEMFC, hydrogen fuel is oxidized at the anode and oxygen is reduced at the cathode, generating electricity and releasing water as a benign by-product. Current commercial PEMFCs utilize expensive platinum-based catalysts for both the anode and cathode. In particular, prohibitively large Pt loadings are required at the cathode to overcome the sluggish kinetics of the oxygen reduction reaction (ORR). While much work has focused on improving the mass activity of Pt ORR catalysts, limitations, including scarcity, instability, and susceptibility to carbon monoxide poisoning, remain. Therefore, the discovery of earth abundant, non-precious metal ORR catalysts is of critical interest for the large-scale implementation of fuel cell technology.

Many non-platinum group (non-PGM) materials have been explored for the ORR. Transition metal oxide and nitrogen-doped carbon catalysts have shown promising activity in alkaline electrolyte and metal-nitrogen-carbon catalysts have achieved Pt-like activity in acid. Another promising class of earth-abundant materials are the transition metal nitrides, which are electronically conductive and have shown enhanced catalytic activity relative to their parent metal. Moreover, nitrides have achieved activity approaching that of the noble metals for a variety of reactions. ORR activity has been demonstrated for several nitrides, including Co, Fe, and Ti. Nitrides of Mo and W have also shown promising stability in acidic electrolyte due to their high corrosion resistance. Particular interest has focused on the bimetallic nitride $Co_{0.6}Mo_{1.4}N_2$, which combines the activity of $Co_xN$ with the acid stability of $Mo_xN$.

Nickel-based nitride catalysts have also shown some ORR activity. Specifically, a high surface area $Ni_3N$ on Ni-foam catalyst demonstrated low overpotential and good stability for HER and OER, as well as preliminary evidence of activity for the ORR in alkaline media. $Ni_3FeN$ nanostructures have shown promising bifunctional activity, both as supports and catalysts, for metal-air batteries in alkaline media. Additionally, $Ni_3N$ quantum dots supported on NiO nanosheets have shown good activity and stability for the ORR in alkaline electrolyte.

Despite promising activity, most transition metal nitride catalysts deactivate under reaction conditions. This deactivation is likely due to structural or compositional changes on the catalyst surface that impede or reduce the number of reactive sites. To be able to design better catalysts it is vital that the structural or compositional changes that happen under reaction conditions improve activity.

What is needed is a device and method of an ORR active transition metal nitride catalyst having an ORR oxidized surface layer that is formed in-situ on a surface of the transition metal nitride layer using an application of oxidizing electrochemical bias.

SUMMARY OF THE INVENTION

To address the needs in the art, an electrode catalyst for an Oxygen Reduction Reaction (ORR) is provided that includes a transition metal nitride layer on a substrate, an ORR catalyst surface oxide layer deposited on the transition metal nitride layer, where the ORR catalyst surface-oxide-layer includes from sub-monolayer to 20 surface oxide monolayers.

According to one aspect of the invention, a transition metal of the transition metal nitride layer includes Mo, Ni, Co, Fe, V, Ta, W, and Mn.

In another aspect of the invention, the transition metal nitride layer is an amorphous structure or a crystalline structure.

In a further aspect of the invention, the transition metal nitride layer includes a morphology of nanostructured particles, microstructured particles, and thin films.

According to another aspect of the invention, the substrate includes carbon, conductive oxides, or metals.

In yet another aspect of the invention, the electrode includes a fuel cell cathode, a proton exchange membrane fuel cell cathode, or an air-battery cathode.

According to one aspect of the invention a method of forming an electrode catalyst for an ORR is provided that includes depositing a transition metal nitride layer on a substrate, using reactive sputtering deposition, and forming an oxidized surface layer in-situ on the surface of the transition metal nitride layer using an application of oxidizing electrochemical bias.

In one aspect of the method, a transition metal of the transition metal nitride layer includes Mo, Ni, Co, Fe, V, Ta, W, and Mn.

According to a further aspect of the method, the transition metal nitride layer is amorphous or of any crystal structure.

In yet another aspect of the method, the electrode includes a fuel cell cathode, a proton exchange membrane fuel cell cathode, or an air-battery cathode.

According to one aspect of the method, the transition metal nitride layer has a morphology that includes nanostructured particles, microstructured particles, or thin films.

According to a further aspect of the method, the substrate includes carbon, conductive oxides, or metals.

DETAILED DESCRIPTION

Figure 1:
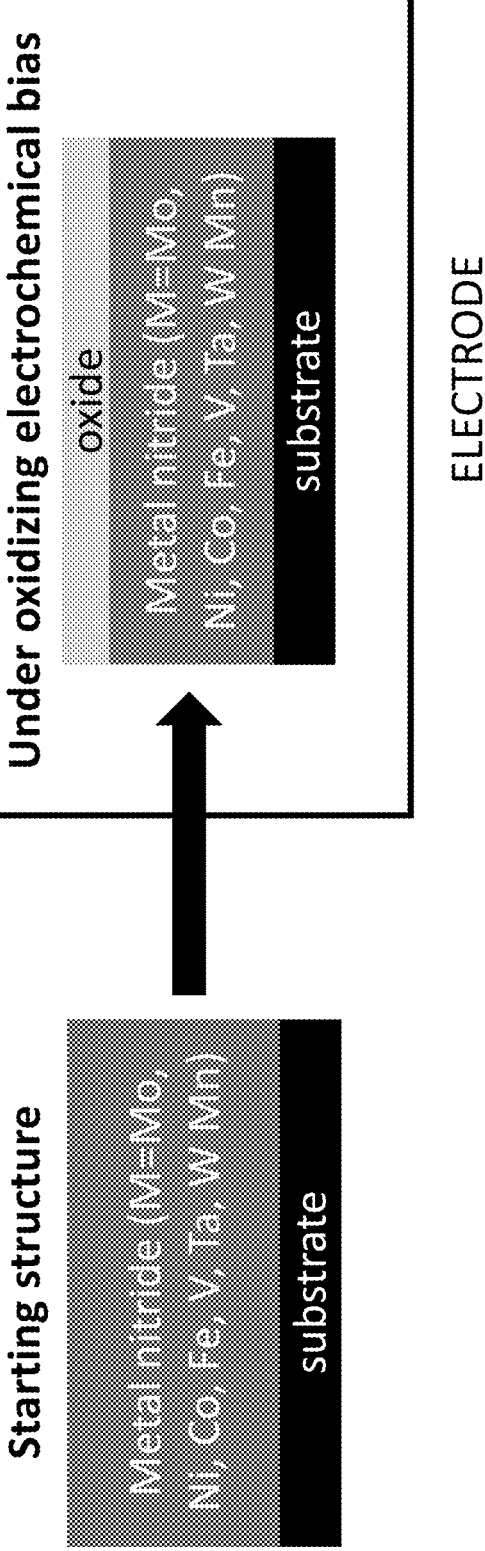
FIG. 1 shows a transition metal nitride catalyst with a thin oxidized surface layer that is formed in situ via the application of electrochemical bias, according to one embodiment of the invention.

The current invention provides transition metal nitride catalysts with a thin oxidized surface layer that is formed in situ via the application of electrochemical bias, as shown in the schematic drawing of FIG. 1. Here, transition metal nitride layer is deposited on a substrate, and an ORR surface oxide layer deposited on the transition metal nitride layer, where the ORR surface oxide layer includes from submonolayer to 20 surface oxide monolayers. The ORR surface oxide layer can be tuned to have varied ranges of the monolayers that include <1-1, 1-2, 1-3, 1-5, 1-10, 1-15, and 1-20 monolayers.

According to the current invention, the following aspects are further embodiments of the invention that include:
1. The transition metal nitride layer is an amorphous structure or a crystalline structure.
2. The transition metal nitride layer includes a morphology of nanostructured particles, microstructured particles, and thin films.
3. The substrate includes carbon, conductive oxides, or metals.
4. The electrode includes a fuel cell cathode, a proton exchange membrane fuel cell cathode, or an air-battery cathode.

To form the transition metal nitride catalysts with a thin oxidized surface layer, the synthesis of nickel nitride as one example of a transition metal catalyst is provided herein, where it is understood that other embodiments that include a transition metal nitride layer includes Mo, Ni, Co, Fe, V, Ta, W, and Mn. Although the nitrides are the starting structures, it is emphasized that the catalyst according to the current invention is the surface oxidized metal nitride formed in situ through the application of oxidizing potentials. In this example, nickel nitride thin films were prepared by DC reactive sputtering using a Lesker Sputter. Prior to the nitride synthesis, a 20 nm thick Ti sticking layer was synthesized by sputter deposition (3 minutes, 200 W, 100% Ar, 3 mTorr) onto the polished glassy carbon disk electrode. Subsequently, without breaking vacuum, the Ni target was sputtered in a mixture of 75% Ar, 25% $N_2$ plasma to deposit ~130 nm of $Ni_xN$. The magnetron power supply was maintained at 200 W and the chamber pressure was 8 mTorr. The substrate was held at 180±10° C. with a substrate bias of 100 V throughout the deposition. Films were also synthesized on Si wafers, with native $SiO_2$ layer, for structural characterization.

To characterize the film, grazing-incidence X-ray diffraction (GI-XRD) data were s obtained using a D8 Venture single crystal diffractometer (Bruker, λ=1.5418 Å) at an incidence angle of 5°. Top-down and cross-sectional scanning electron microscopy (SEM) was conducted with a FEI Magellan 400 XHR SEM. X-ray photoelectron spectroscopy (XPS) was performed with a Phi Versaprobe 1 using monochromatized Al Kα (1486 eV) radiation. All XPS spectra were calibrated to the C 1s peak at a binding energy of 284.8 eV. CasaXPS software was used to perform peak fitting with Shirley backgrounds.

Electrochemistry was performed using a rotating disk electrode (Pine Research Instrument) in a three-electrode glass cell, with 0.1 M $HClO_4$ or 0.1 M KOH electrolyte purged with oxygen or nitrogen. An in-house built reversible hydrogen electrode (RHE) was used as the reference electrode and a graphite rod as the counter electrode. The series resistance of the cell was measured at 100 kHz and the iR losses were compensated at 85%. The remaining 15% was corrected after testing. Electrochemical activity was assessed using cyclic voltammetry (CV), sweeping reversibly from 0.8 V to 0.05 V at a scan rate of 20 mV/s using a Biologic VSP-300 Potentiostat. Unless otherwise stated, the oxygen purged voltammograms were corrected for background current by subtracting the baseline (nitrogen) sweep. Stability was evaluated using chronoamperometry, holding at a constant potential of 0.15 V. Selectivity measurements were conducted using a rotating ring disk electrode (Pine Research Instrument) with a Pt ring held at 1.2 V vs RHE to measure the $H_2O_2$ produced in the reaction.

Density functional theory (DFT) calculations were performed using the Vienna Ab Initio Simulation Package (VASP) with the PBE exchange-correlation functional and projector augmented-wave (PAW) pseudopotentials. A Hubbard-U correction (PBE+U) was added on insulating Ni oxide materials to include the on-site Coulomb interaction of localized electrons. The value of the Hubbard interaction, U, for Ni was chosen to be 6.2 eV in accordance with the literature. The energy cutoff, convergence criteria for selfconsistent iterations, and for geometry relaxation were set to 500 eV, $10^{-4}$ eV, 0.05 eV/Å, respectively.

Figure 2:
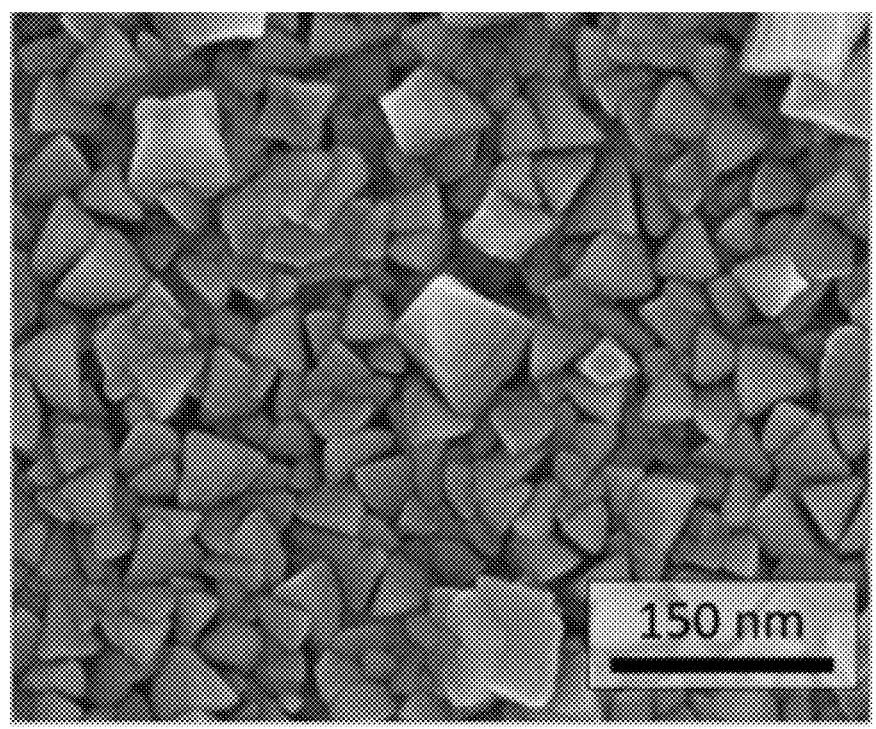
FIG. 2 shows characterization of as-prepared, sputtered $Ni_xN$ thin films. Top down SEM micrograph, according to one embodiment of the invention.

In this example, the reactively sputtered nickel nitride films are ~130 nm in thickness. A 20-30 nm Ti sticking layer is deposited beneath the nickel nitride film. A top down SEM micrograph in FIG. 2 shows that the nickel nitride film forms pyramidal shapes, with either square or triangular base shapes. The larger square prisms have an average diameter (distance from opposite corners, viewed from above) of 70 nm, while the triangular prisms are 30-40 nm.

Figure 3:
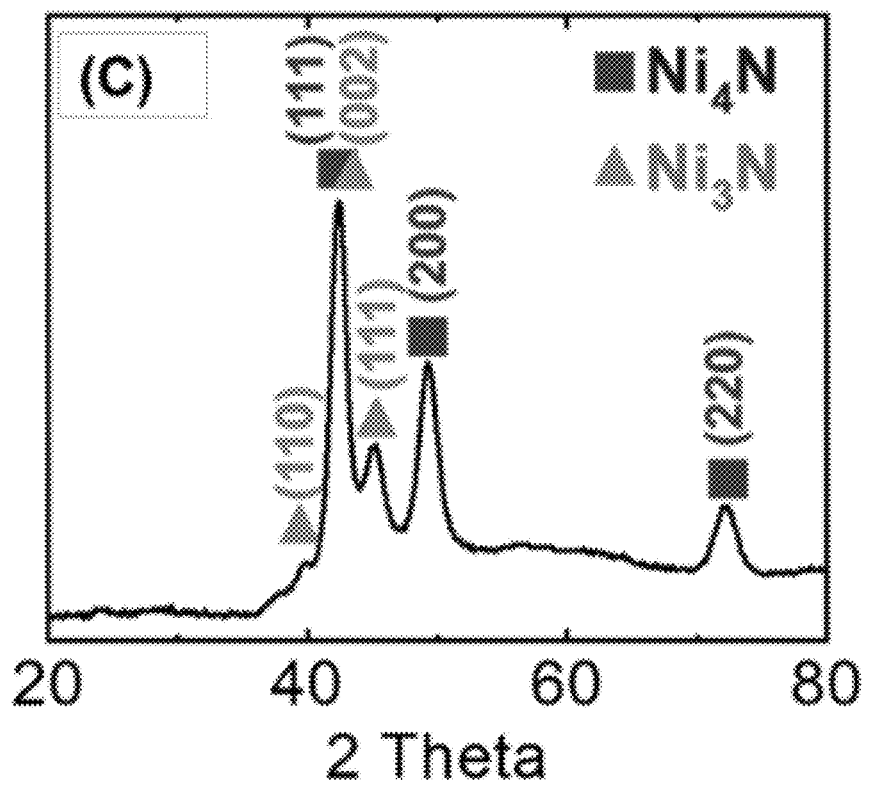
FIG. 3 shows characterization of as-prepared, sputtered $Ni_xN$ thin films. GI-XRD pattern with references and corresponding crystal planes, according to one embodiment of the invention.

GI-XRD of the nickel-based thin films showed peaks corresponding to both hexagonal $Ni_3N$ (ICDD 00-010-0280 at 2Θ of 39.9°, 42.7°, and 45.2°) and cubic $Ni_4N$ (ICDD 00-036-1300 at 42.0°, 49.3°, and 72.0°), confirming that no other crystalline species are present (FIG. 3).

Figure 4A:
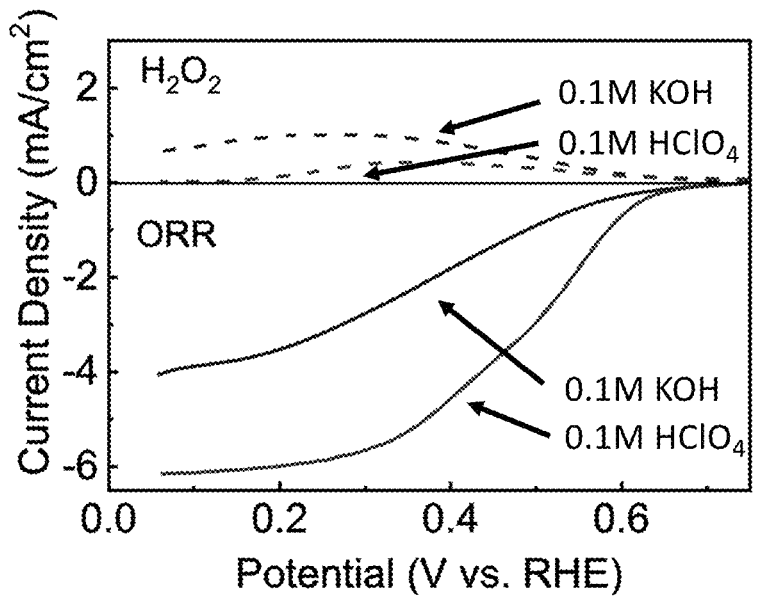
FIGS. 4A-4B show electrochemical performance in 0.1M $HClO_4$ and 0.1M KOH at 1600 rpm. (4A) RRDE measurements showing ORR polarization curves and $H_2O_2$ current density for nickel nitride. (4B) chronoamperometry (CA) stability profile at 0.15 V vs RHE, according to one embodiment of the invention.

Regarding electrochemistry, the ORR activity and selectivity of the nickel nitride catalyst was assessed using a rotating ring disk electrode (RRDE) in both acidic (0.1 M perchloric acid) and alkaline (0.1 M potassium hydroxide) electrolyte. FIG. 4A shows the activity and selectivity of the synthesized catalyst, with the ORR polarization curve measured on the disk electrode (solid lines) and the $H_2O_2$ oxidation current measured on the platinum ring electrode (dashed lines). In acid, the ORR onsets (defined as the potential required to reach 100 $\mu A/cm^2$ geometric current density) at 0.68 V vs RHE and reaches the mass transport limited current density of 6.1 $mA/cm^2$ at 0.2 V vs RHE. Furthermore, the halfwave potential is 0.49 V vs RHE, indicating a relatively sharp onset. This is promising activity for a non-Pt group metal catalyst in acid and is comparable to some of the highest performing metal nitrides currently reported in the literature. In alkaline electrolyte, nickel nitride shows similar activity with an onset at 0.68 V vs RHE but has a lower mass transport limited current density of 4 $mA/cm^2$, as well as a slower onset with a halfwave potential of 0.42 V vs RHE.

For PEMFCs, high selectivity to the 4-electon reduction, corresponding to a low $H_2O_2$ current, is preferred. In acid, the selectivity of the catalyst to $H_2O_2$ (2-electron reduction) was found to decrease with increasing overpotential and was negligible at potentials below 0.3 V vs RHE. The $H_2O_2$ current was used to calculate the electron transfer number, n, which was found to range from 3.2 (at 0.6 V vs RHE) to 4.0 (at 0.1 V vs RHE). In alkaline electrolyte has higher selectivity towards $H_2O_2$, with n values ranging from 2.4 at 0.6 V vs RHE up to 3.4 at 0.1 V vs RHE.

Figure 4B:
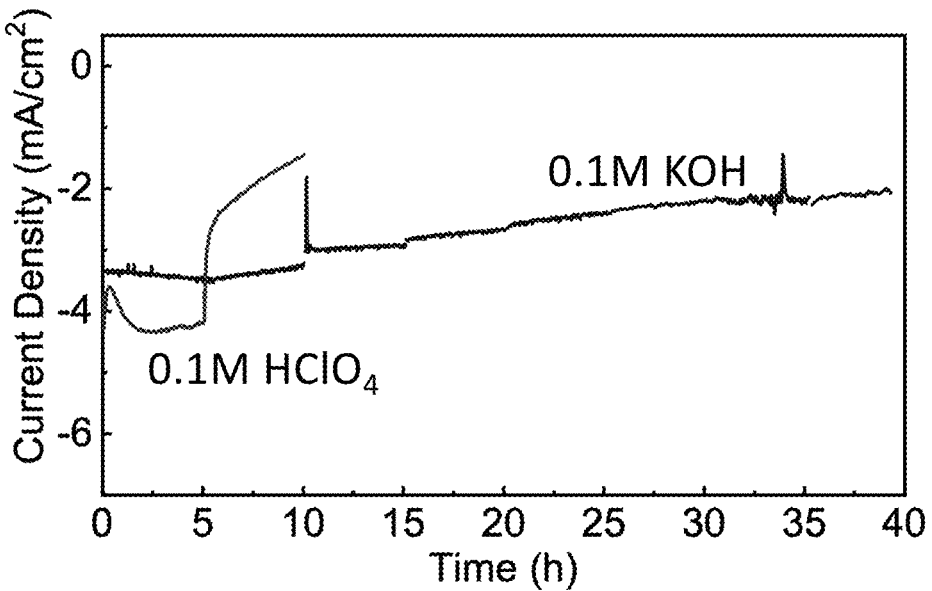

Interestingly, the activity and stability of the nickel nitride catalyst was found to be dependent on the cycling parameters. After 3 CV cycles in acid, catalyst stability was evaluated by chronoamperometry (CA), at 0.15 V vs RHE (FIG. 4B). CVs were run every 5 h to assess changes in activity. The CV after 5 h was detrimental and resulted in loss of activity. Nevertheless, the catalyst demonstrated stability for 10 h in acid electrolyte. The losses caused by the CV during the stability test suggest that the catalyst is very sensitive to applied potential.

Sensitivity to potential is a consequence of surface oxidation reactions that occur in the ORR potential window. In both $N_2$ and $O_2$ scans, there was an irreversible oxidative peak on the anodic sweep in the 0.65-0.8 V vs RHE region during the first 4 sweeps. Between sweeps 1 and 3, this results in a positive shift in onset potential by 100 mV and a 2 $mA/cm^2$ gain in mass transport limited-current density. This oxidation peak shrinks after 4 sweeps, indicating that further oxidation of the catalyst was limited. This coincided with a loss of activity, with current density decreasing to zero over the subsequent 4 sweeps. Therefore, the active surface is a nitride with sub-monolayer-20 monolayers of surface oxide formed via the application of electrochemical bias. Activity is suppressed when more than 20 oxide monolayers form, due to decreased conductivity and increased dissolution. FIG. 4B shows the stability test for nickel nitride in alkaline electrolyte. The catalyst improved over the first 5 h of the CA hold, increasing from 3.3 to 3.5 $mA/cm^2$ of current density in the CA, and the CV after 5 h demonstrated improvement of 20 mV and 75 mV in onset and half-wave potential, respectively. The noise in the data, observed at 3 h, is due to bubble formation on the surface of the catalyst. The bubble was removed mechanically and had no lasting effect on catalyst performance. All other spikes correspond to switching between the CA and CVs. The catalyst continued to degrade slowly, with current density losses of 25% at 24 h and 40% at 40 h, at which time the stability test was ended.

Figures 5A, 5B, 5C:
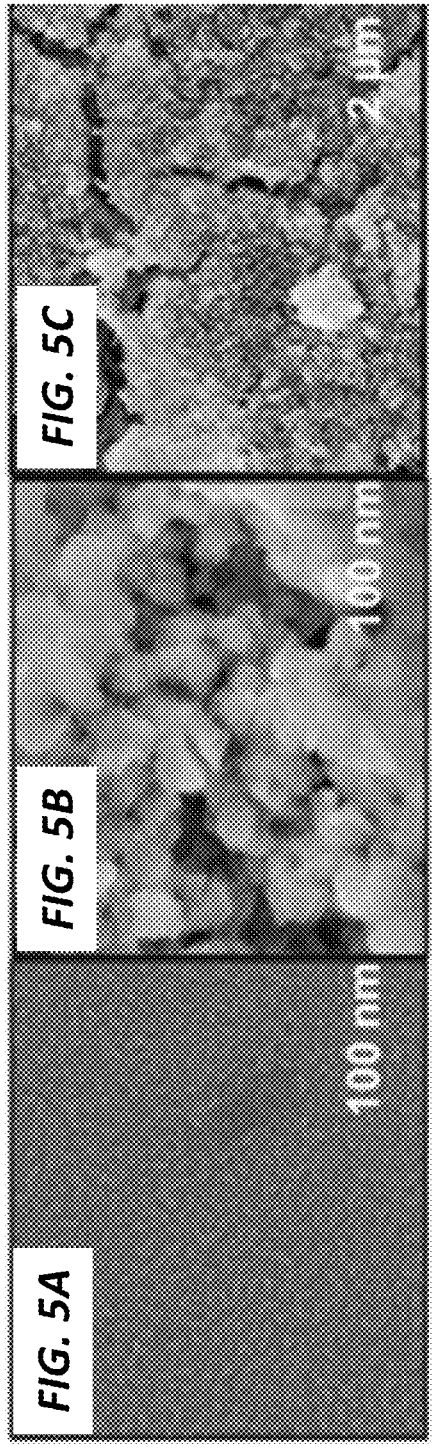
FIGS. 5A-5D show top down SEM images of the nickel nitride films after (5A) stability test in acid, and (5B, 5C) stability test in base. (5D) High-resolution XPS spectra for as-prepared (top row), post-stability acid (center row), and post-stability base (bottom row) for Ni 2p, O 1s, and N 1s regions. Dashed lines are intended as guides for the reader, according to one embodiment of the invention.

To investigate the mechanisms of failure in acid and base, the films were characterized after activity (CV) and stability (CA) testing using SEM and XPS. After the 10 h CA in acid (FIG. 5A), SEM shows that the surface structure had changed completely, with almost all material gone. This structural change likely contributes to the loss in performance over time. After the 40 h CA in base (FIGS. 5B-5C), the structure is distinct from the as-prepared catalyst. The surface was covered with rod-shaped structures, loosely-packed into clusters approximately 0.1 $\mu m^2$ in area, and large cracks (approximately 300 nm across) appeared in the film. It is speculated that these cracks may have undercut the film, disturbing its electrical connectivity and performance.

Figure 5D:
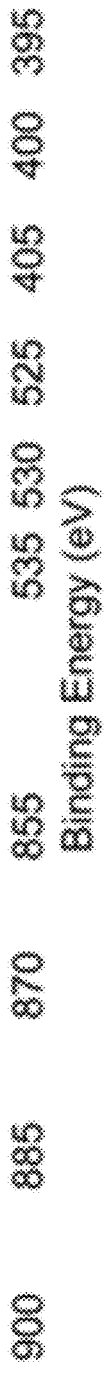

The XPS spectra (FIG. 5D) also show a change in elemental composition. Elemental quantification of the nickel nitride revealed a ratio of Ni to N of approximately 3.5, consistent with a mixture of $Ni_3N$ and $Ni_4N$ observed in GI-XRD. Prior to testing, peaks were identified in the Ni $2p_{3/2}$ region at binding energies of 853.0 and 855.2 eV (dashed lines), corresponding to the interstitial nitride ($Ni^{\delta+}$, δ=0-2) and oxide ($Ni^{2+}$), respectively. There are satellite peaks in the region 860-865 eV. This matches well with literature spectra for nickel nitride. In the O 1s region, the low energy peak at 529.3 eV corresponds to the nickel oxide, while we associate the higher energy peak with hydroxide (literature value of 531.1 eV) and carbonyl species (most likely carbonate, literature value of 532.8 eV). Finally, the N 1s peak at 397.6 eV corresponds to a metal nitride.

After stability testing in acid, the surface composition changed drastically. The Ni $2p_{3/2}$ peaks shifted to higher binding energies, with the largest peak at 855.8 eV, indicating the $Ni^{2+}$ oxidation state. The N 1s peak disappeared, corresponding to a loss of nitrogen from the surface. The O 1s peaks increased in intensity relative to the Ni and indicate the presence of hydroxide and carbonate species (from air exposure prior to characterization). In conjunction with the structural changes observed by SEM, this suggests an extensive reorganization of the surface during testing, resulting in a surface that more closely resembles $Ni(OH)_2$ than the original $Ni_4N$. Similar, composition changes were observed after CV testing in acid.

The composition change after stability testing in base is similar. The primary remaining Ni $2p_{3/2}$ peak is at 855.9 eV and there is no N 1s signal at the surface, suggesting a complete conversion at the surface to a hydroxide structure. The O 1s spectrum shows a small oxide peak, but hydroxide is the dominant species. Comparatively, the composition changes after CV testing are minor, with nitride composition retained. This electrochemical, microscopic, and spectroscopic investigation of stability and failure mechanisms has revealed that activity loss is correlated with the complete conversion of the nitride to hydroxide and associated material property changes.

Figure 6A:
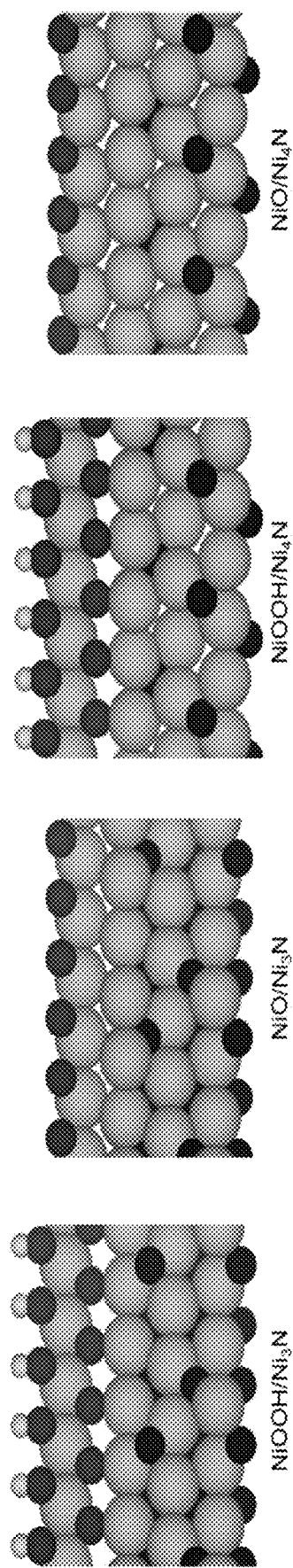
FIGS. 6A-6D show (6A) optimized geometries of monolayers of NiO and NiOOH supported on $Ni_3N$ and $Ni_4N$. Pourbaix diagrams of (6B) unsupported bulk Ni, (6C) $Ni_4N$, and (6D) $Ni_3N$. (6B) is based on the experimental values of formation free energies of bulk phases, and the stabilization energies of nickel nitrides on NiOOH were added to construct (6C) and (6D). Color codes: silver (Ni), blue (N), red (O), pink (H). The equilibrium potentials of $O_2/H_2O$ (1.23 $V_{RHE}$) and $H^+/H_2$ (0.00 $V_{RHE}$) are marked with dashed lines, according to one embodiment of the invention.

To gain insight into oxide phases observed experimentally, the stability of oxide phases in the presence of $Ni_3N$ and $Ni_4N$ were evaluated with DFT. The optimized bulk structures of $Ni_3N$ and $Ni_4N$ are in good agreement with the GI-XRD and SADP results, as well as previously reported bulk parameters (a=b=4.619 and c=4.307 Å for $Ni_3N$, a=b=c=3.730 Å for $Ni_4N$). $\sqrt{3}\times\sqrt{3}$ structures were modeled for $Ni_3N$ (0001) and $Ni_4N$ (111) to minimize the lattice mismatch between nickel nitrides ($Ni_3N$ and $Ni_4N$) and nickel oxides (NiOOH and NiO). Monolayer films of NiOOH and NiO supported on $Ni_3N$ and $Ni_4N$ were simulated. All possible adsorption sites and surface termination were considered to minimize the oxide nitride interface formation energy. The most stable geometries for NiOOH and NiO on $Ni_3N$ and $Ni_4N$ are shown in FIG. 6A.

Figure 6B:
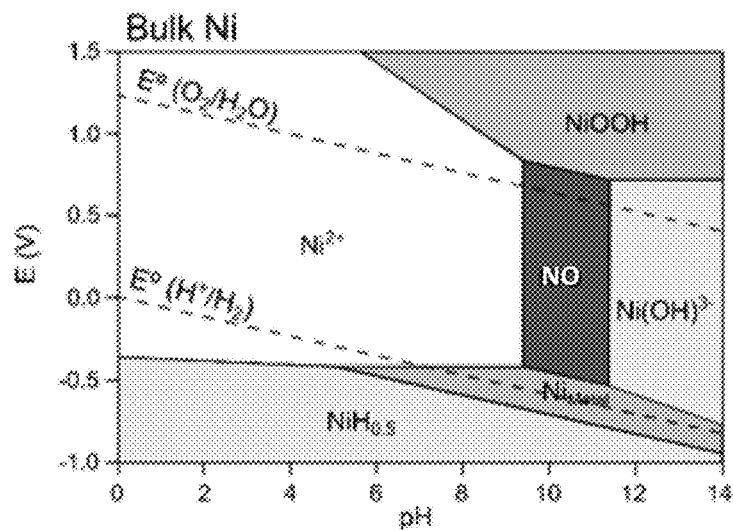
Figure 6C:
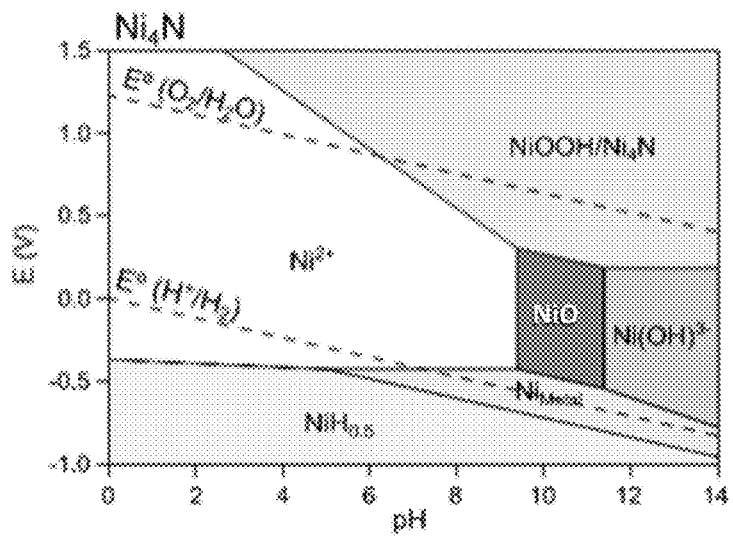
Figure 6D:
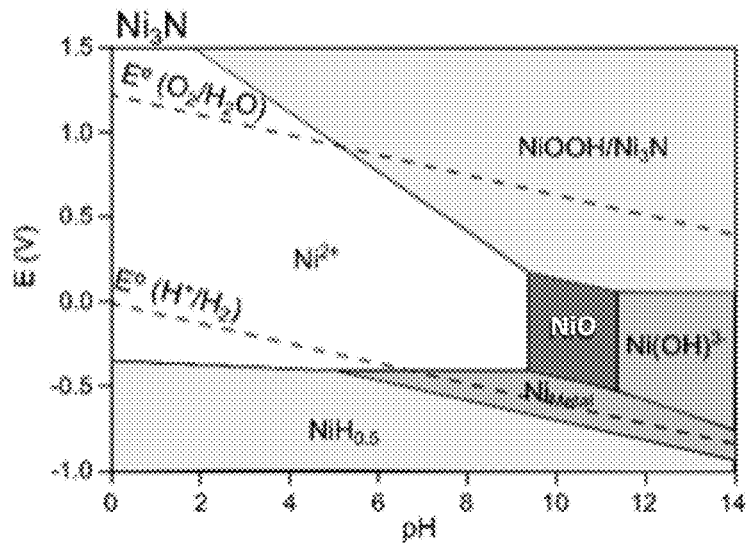

FIGS. 6B-6D show the theoretically calculated Pourbaix diagrams for Ni, $Ni_4N$, and $Ni_3N$, respectively. The region of interest for ORR is 0.2 $V_{RHE}$ to 1.23 $V_{RHE}$, below the upper dashed line in the Pourbaix diagram. The strong formation energy of NiOOH on both $Ni_3N$ and $Ni_4N$ results in the expansion of NiOOH area in the Pourbaix diagrams (FIGS. 6c and d). Hence, the observed oxidized phase in the experiment can be attributed to the stabilized NiOOH on the nickel nitride surfaces. This analysis also shows that nickel nitride surfaces are not stable under acidic environment due to dissolution of $Ni^{2+}$ ions.

This example theoretical investigation provides a basic understanding of the formation of possible nickel oxide phases on the examined nickel nitrides, which is in agreement with the experimental observation of extensive surface oxidation after ORR testing. While the XPS results indicate a surface hydroxide species, these are ex situ measurements, taken after the catalysts had been exposed to air, and thus cannot be used to determine the surface composition under reaction conditions. This will be the subject of future investigations utilizing operando spectroscopies.

It is important to note that the Pourbaix diagram is based on thermodynamics and does not provide any information about the kinetics of the phase transition. Thus, while the nickel nitride is not predicted to be stable in acid, several hours of stability were achieved, perhaps because the oxidation or dissolution processes are slow kinetically. This can serve as a design principle for further catalyst development. Superior stability is observed in base, where the catalyst is more thermodynamically stable.

Nickel nitride thin films in this example of transition metals were found to be active ORR catalysts, achieving activity comparable to some of the most active metal nitrides reported in the literature. Reactive sputtering is an effective route to synthesize transition metal nitride electrocatalysts with a variety of compositions and crystal structures, allowing for fundamental investigation of the active surface. Synthesizing the catalyst in a carbon-free morphology, enabled the use of a combined experiment-theory approach to isolate the activity of the nickel nitride and it was found that it is an active and reasonably stable non-precious metal catalyst for ORR in acid, as well as in base. Ex situ XPS characterization indicated that an oxide overlayer readily forms on the catalyst surface. DFT calculations predicted similar surface oxidation under reaction conditions, which was shown to correlate with changes in electrochemical activity and stability.

In another embodiment of the current invention, tantalum and vanadium nitrides are the materials under investigation. The TaN, VN, and TaVN thin films were synthesized by DC reactive sputtering, analogously to the nickel nitride films in the previous embodiment. The Ta or V target was sputtered in mixture of Ar (50%) and $N_2$ (50%) plasma for 15 minutes. The magnetron power supply was maintained at 150 W and the chamber pressure was 6 mTorr. The substrate was held at 20° C. with a substrate bias of 250 V throughout the deposition. Films were also synthesized on Si wafers, with native $SiO_2$ layer, for structural characterization. As is in the previous embodiment, GI-XRD data were obtained using a D8 Venture single crystal diffractometer (Bruker, λ=1.5418 Å) at an incidence angle of 5°. Electrochemistry was performed using a rotating disk electrode in 0.1M KOH electrolyte, analogously to the previous embodiment.

Figure 7A:
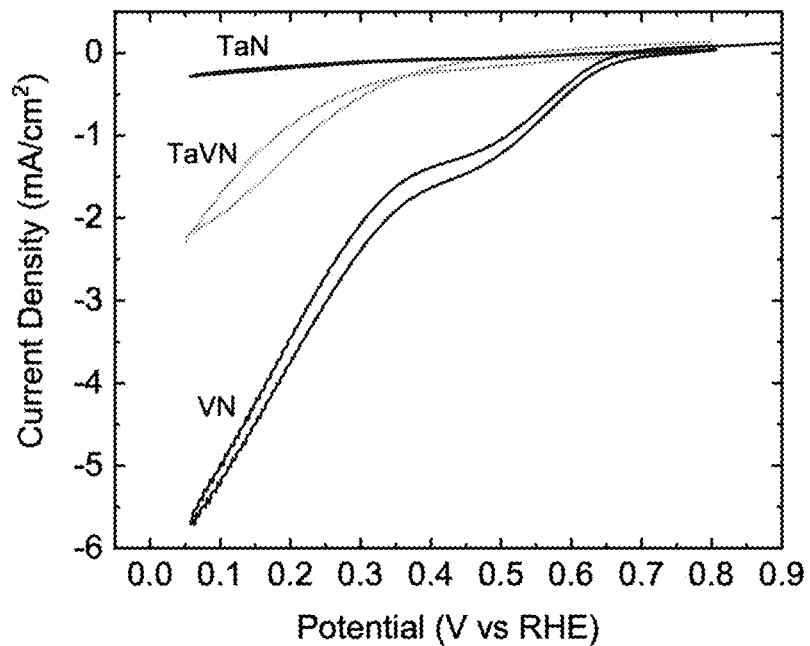
FIGS. 7A-7B show characterization of TaN, VN, and TaVN thin films. (7A) CVs for TaN, VN, and TaVN in 0.1M KOH at 1600 rpm. (7B) GI-XRD pattern with ICDD references, according to one embodiment of the invention.
Figure 7B:
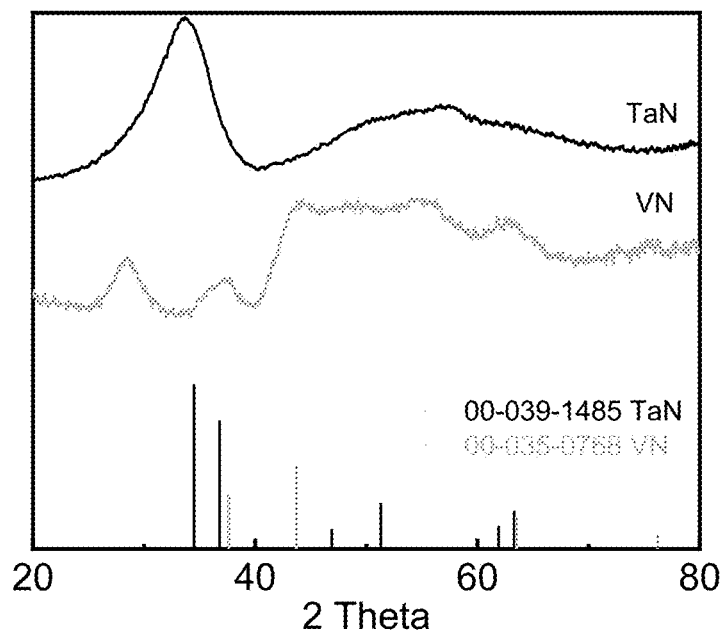

GI-XRD measurements showed that the films are weakly crystalline, with broad peaks corresponding to TaN and VN (FIG. 7A). The ORR activity of TaN, VN, and TaVN in 0.1M KOH is shown in FIG. 7B. VN is the most active catalyst, with an onset potential of 0.65 V vs RHE.

In another embodiment of the current invention, the main materials under investigation are molybdenum nitrides. In this example, molybdenum nitride thin films were prepared by DC reactive sputtering using a Lesker Sputter. Prior to the nitride synthesis, a 10 nm thick Ti sticking layer was synthesized by sputter deposition (2 minutes, 200 W, 100% Ar, 3 mTorr) onto the polished glassy carbon disk electrode. Subsequently, without breaking vacuum, a thin Mo metal layer was deposited (1 minute, 100 W, 100% Ar, no bias) then the Mo target was sputtered in a mixture of Ar and $N_2$ (25-100% $N_2$) plasma to deposit ~30 nm of $Mo_xN$. The magnetron power supply was maintained at 200 W and the chamber pressure was 6 mTorr. The substrate was held at 180±10° C. with a substrate bias of 100-200 V throughout the deposition. Films were also synthesized on Si wafers, with native $SiO_2$ layer removed, for structural characterization.

To characterize the film, GI-XRD was performed at beamline 2-1 at the Stanford Synchrotron Radiation Lightsource (SSRL) at SLAC National Accelerator Laboratory. GI-XRD data was collected using a photon energy of 17 keV. Grazing angles of 0.1-0.5° were used to obtain structural information from different depths within the film. Scattering measurements were converted from two-dimensional Pilatus images to two-theta values by integrating pixel rows of the images. The integrated data was then smoothed using a Savitzky-Golay filter, background corrected, and refraction corrected to account for the effect of grazing angle on x-ray refraction. Electrochemistry was performed in a three-electrode glass cell, analogously to the previous embodiment.

Operando grazing incidence X-ray absorption spectroscopy (GI-XAS) was performed at beamline 11-2 at SSRL. During measurements, electrochemistry was performed in a 3-electrode configuration using the custom-built grazing incident cell and a Biologic VSP-300 Potentiostat. A Pt wire counter electrode and Ag/AgCl reference electrode were used. A polyimide (Kapton) film was stretched over the top of the cell opening to seal it and maintain a thin electrolyte (0.1M $HClO_4$) layer on the catalyst surface. Oxygen was bubbled into the electrolyte. GI-XAS was measured at the Mo K-edge (20 keV). XAS spectra were processed using the Athena software and EXAFS spectra were fit using the Artemis software.

Figure 8A:
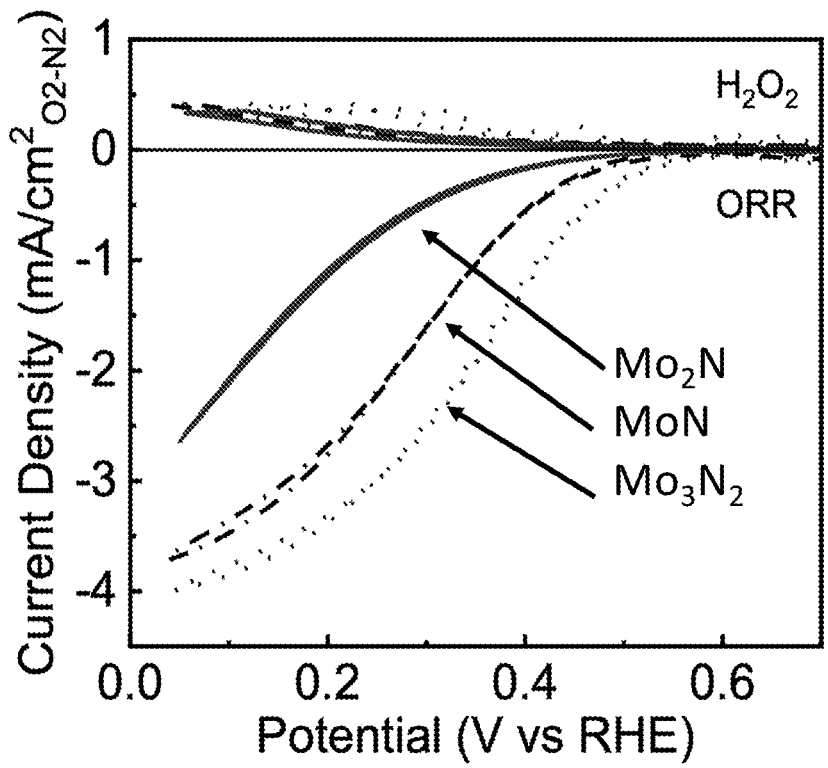
FIGS. 8A-8B show characterization of 3 $Mo_xN$ catalysts. (8A) CVs in 0.1M $HClO_4$ at 1600 rpm. (8B) Surface and bulk GIXRD.
Figure 8B:
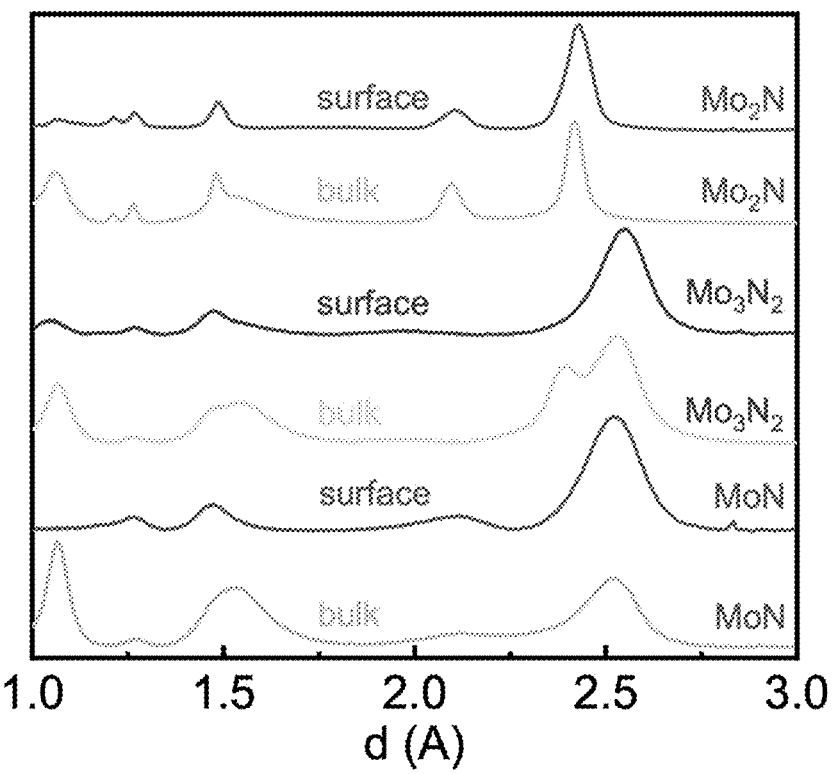

The process of synthesizing carbon-free thin film morphologies, according to the current invention, allows for improved catalyst characterization, as well as identification of the active material. By varying the synthesis conditions, nitride films with various crystal structures and thicknesses were obtained. GI-XRD measurements indicate that the films are composed of a mixture of hcp MoN, fcc $Mo_2N$, and bcc Mo structures (FIG. 8B). These films, with nominal compositions of $Mo_2N$, $Mo_3N_2$, and MoN, were found to be active and stable, with the most active films demonstrating onset potentials (at $-0.1$ mA $cm^{-2}$) between 0.5 and 0.6 V vs RHE (FIG. 8A). Activity, stability, and selectivity in acid electrolyte were found to depend on the catalyst structure.

Figure 9B:
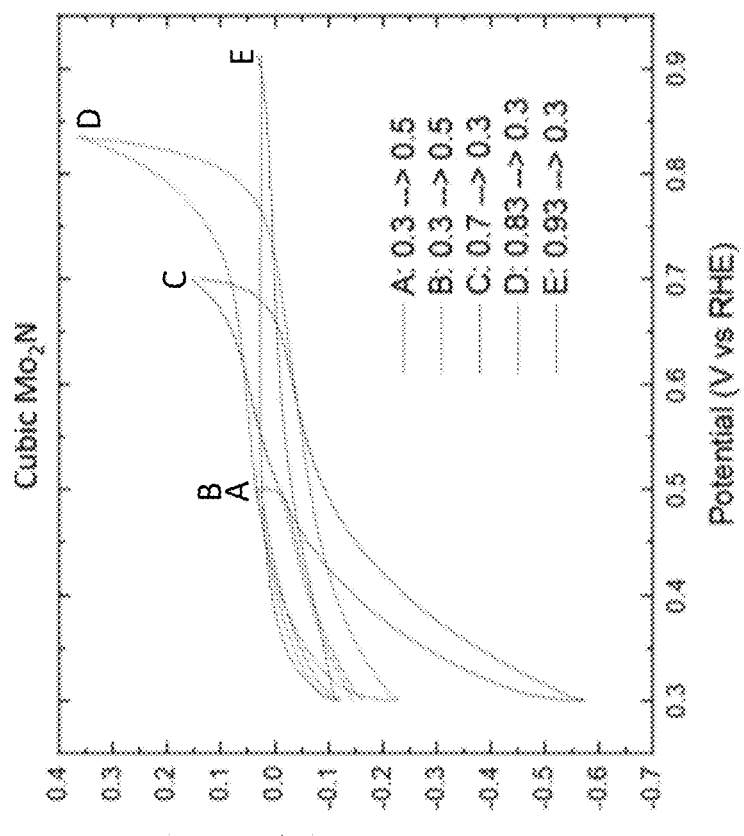
FIGS. 9A-9B show CVs for (9A) MoN and (9B) $Mo_2N$ in 0.1M $HClO_4$ at 1600 rpm. Prior to each CV, the electrode was held at the first potential for 2 minutes. Increased activity through application of higher potentials is evident, according to one embodiment of the invention.
Figure 9A:
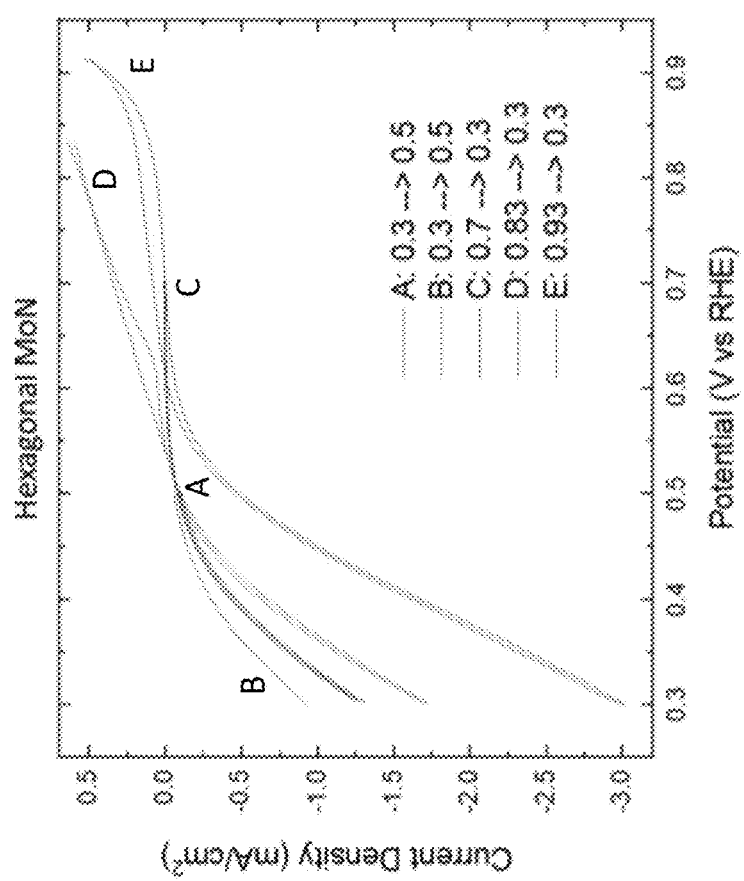

The electrochemical performance of the nitrides is also dependent on the oxidizing potentials to which they are cycled. FIGS. 9A-9B show cyclic voltammetry (CV) data for MoN and $Mo_2N$ samples, where the sample is held at the first potential for 2 minutes and then cycled. This shows that (1) ORR activity is improved by the application of an oxidizing potential, and (2) the potential that must be applied for this activation to occur depends on the starting material. Thus, this method is both generally applicable and tunable.

Figures 10A, 10B:
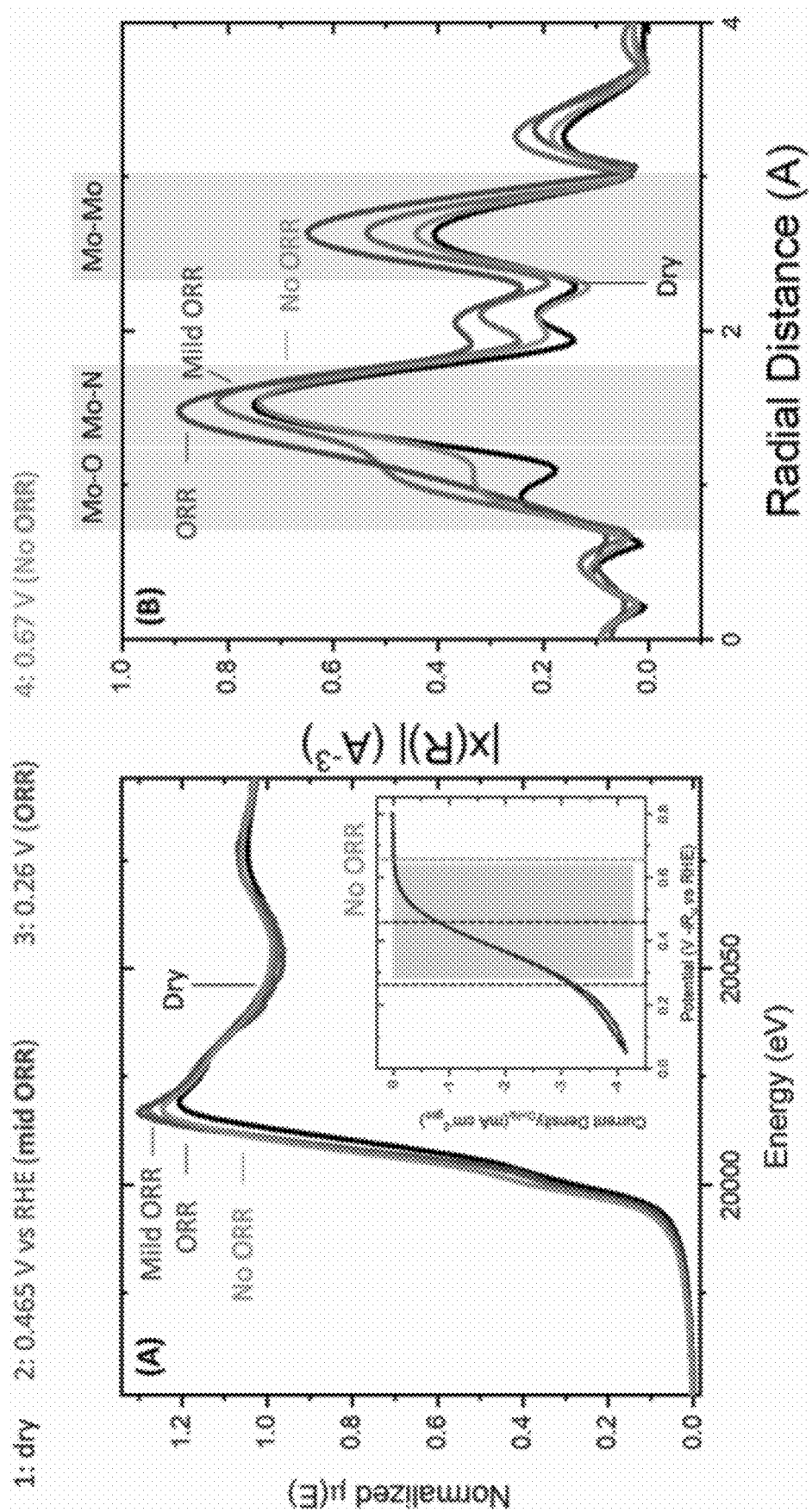
FIGS. 10A-10B show Operando Mo K-edge GI-XAS spectra for MoN catalysts. (10A) XANES and (10B) EXAFS for ex-situ and applied potentials of 0.465 V vs RHE, 0.26 V vs RHE, and 0.67 V vs RHE in 0.1M $HClO_4$. The inset in (10A) shows where these potentials fall on an ORR polarization curve, according to one embodiment of the invention.

Operando GI-XAS was used to observe the surface oxidation caused by the application of oxidizing potentials. For these example experiments, the MoN catalyst was held at different potentials for 5 h under ORR conditions while XAS spectra of the surface and bulk of the catalyst film were measured. FIGS. 10A-10B show the surface Mo—K edge (10A) XANES and (10B) EXAFS spectra, which indicate changes in the Mo oxidation state and catalyst surface composition with applied potential. These experiments provide evidence for the formation of an oxidized surface under reaction conditions that is potential-dependent and distinct from the dry surface.

In a final embodiment of the current invention, DFT calculations were used to determine the effect of oxide layers on the ORR activity of the 1st row transition metal nitrides. In a final embodiment of the current invention, DFT calculations were used to determine the effect of oxide layers on the ORR activity of the 1st row transition metal nitrides. Periodic DFT and the computational hydrogen electrode (CHE) were used to estimate adsorption free energy ($\Delta G$) of the reaction intermediates (OOH*, O* and OH*) over a cathode surface. To account for the electrode potential on the free energy change of reaction steps, the standard relation between electrical and chemical potential, $\Delta G=-eU_{elec}$, was used, where e is the elementary charge and $U_{elec}$ is the electrode potential. The catalytic activity of a catalyst is theoretically examined by calculating limiting potential that is defined as the highest potential at which for all the reaction steps $\Delta G \leq 0$. All possible surface adsorption modes of the reaction intermediates are considered, and the mode with the lowest adsorption energy is used to estimate the limiting potential.

The $1^{st}$ row transition metal nitrides (TMNs) were considered in the form of rocksalt terminated with (100) facet. The nitrides were modeled using 2×2 slabs that each contains 24 atoms in six layers, i.e., 12 metal (M) and 12 nitrogen (N) atoms. Adsorbates and the top three layers of the slabs were allowed to relax during the DFT optimization, while the five bottom layers are fixed at their bulk-optimized positions. To investigate the catalytic activity of the nitrides with a thin oxide overlayer, the nitrogen atoms of the top one or two layer(s) of the slabs are replaced with oxygen atoms. For the systems thus prepared, the oxide layer(s) and two top nitride layers were allowed to relax during the geometry optimizations. A vacuum separation of 15 Å between periodic slabs in the z-direction was employed to minimize the influence of the dipole moment formed by molecular adsorption.

All calculations were spin polarized and carried out using the Quantum Espresso package. A revised version of the Perdew-Burke-Ernzerhof functional (RPBE) with Vanderbilt pseudopotential library (GBRV) was employed for the calculations. The kinetic energy cutoff of 500 eV was chosen, and integration was performed in the reciprocal space. Different k-point samplings were tested to check where energy of the systems is converged.

Figure 11:
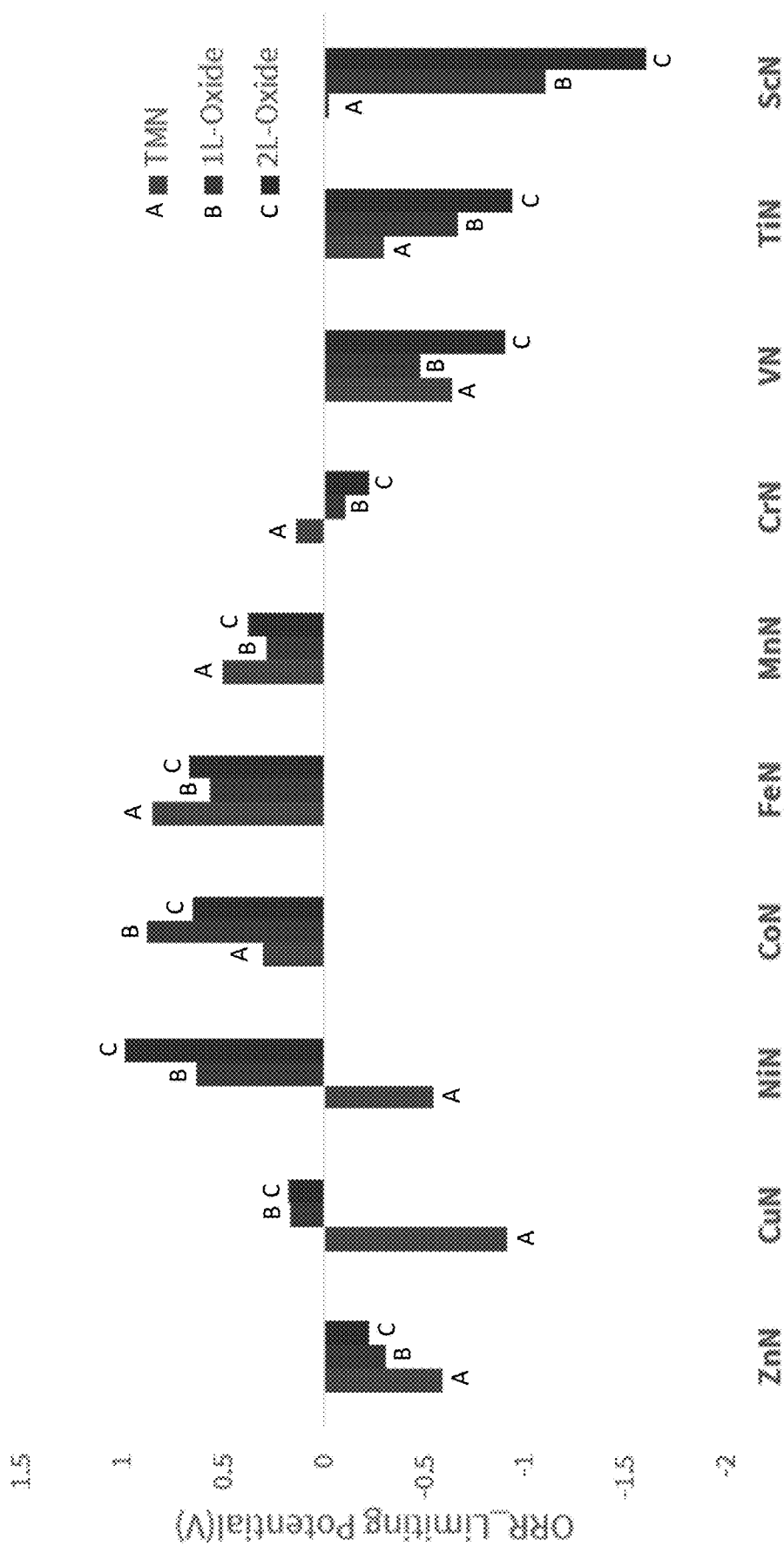
FIG. 11 shows calculations of the limiting potentials for ORR for transition metal nitrides, as well as nitrides with 1 or 2 surface oxide layers, according to one embodiment of the invention.

FIG. 11 shows the ORR limiting potential, the potential at which ORR is thermodynamically favorable, for Zn, Cu, Ni, Co, Fe, Mn, Cr, V, Ti, and Sc nitrides with 0-2 monolayers of oxide on the surface. The results indicate that the principle of transition metal nitrides with surface oxide layers as ORR catalysts is broadly applicable to a variety of transition metals.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. All such variations are considered to be within the scope and spirit of the present invention as defined by the following claims and their legal equivalents.

What is claimed:

1. An electrode catalyst for an Oxygen Reduction Reaction (ORR), comprising:
   a) a transition metal nitride layer deposited on a substrate;
   b) an ORR catalyst electrically conductive, partially oxidized surface layer formed on a surface of the transition metal nitride layer, wherein said ORR catalyst electrically conductive, partially oxidized surface layer is at most 20 monolayers thick.

2. The electrode catalyst for an ORR of claim 1, wherein a transition metal of said transition metal nitride layer is selected from the group consisting of Mo, Ni, Co, Fe, V, Ta, W, and Mn.

3. The electrode catalyst for an ORR of claim 1, wherein a structure of said transition metal nitride layer is selected from the group consisting of an amorphous structure, and a crystalline structure.

4. The electrode catalyst for an ORR of claim 1, wherein said transition metal nitride layer comprises a morphology selected from the group consisting of nanostructured particles, microstructured particles, and thin films.

5. The electrode catalyst for an ORR of claim 1, wherein said substrate is selected from the group consisting of carbon, conductive oxides, and metals.

6. The electrode catalyst for an ORR of claim 1, wherein said electrode is selected from the group consisting of a fuel cell cathode, a proton exchange membrane fuel cell cathode, and an air-battery cathode.

7. A method of forming an electrode catalyst for an Oxygen Reduction Reaction (ORR), comprising:
   a) depositing a transition metal nitride layer on a substrate, using reactive sputtering deposition to produce a deposited transition metal nitride layer; and
   b) in a liquid electrochemical cell cycling between an oxidizing electrochemical voltage bias and a reducing electrochemical voltage bias in a liquid electrolyte to electrochemically form in-situ on a surface of the deposited transition metal nitride layer an electrically-conductive, partially-oxidized surface layer.

8. The method of forming a catalyst for an ORR of claim 7, wherein a transition metal of the deposited transition metal nitride layer is selected from the group consisting of Mo, Ni, Co, Fe, V, Ta, W, and Mn.

9. The method of forming a catalyst for an ORR of claim 7, wherein the deposited transition metal nitride layer is amorphous or of any crystal structure.

10. The method of forming a catalyst for an ORR of claim 7, wherein said electrode is selected from the group consisting of a fuel cell cathode, a proton exchange membrane fuel cell cathode, and an air-battery cathode.

11. The method of forming a catalyst for an ORR of claim 7, wherein the deposited transition metal nitride layer comprises a morphology selected from the group consisting of nanostructured particles, microstructured particles, and thin films.

12. The method of forming a catalyst for an ORR of claim 7, wherein said substrate is selected from the group consisting of carbon, conductive oxides, and metals.

* * * * *